(12) United States Patent  
Loeppert

(10) Patent No.: US 7,297,567 B2  
(45) Date of Patent: Nov. 20, 2007

(54) METHOD FOR SINGULATING A RELEASED MICROELECTROMECHANICAL SYSTEM WAFER

(75) Inventor: Peter V. Loeppert, Hoffman Estates, IL (US)

(73) Assignee: Knowles Electronics, LLC., Itasca, IL (US)

( * ) Notice: Subject to any disclaimer, the term of this patent is extended or adjusted under 35 U.S.C. 154(b) by 0 days.

(21) Appl. No.: 11/275,503

(22) Filed: Jan. 10, 2006

(65) Prior Publication Data

US 2007/0161139 A1    Jul. 12, 2007

(51) Int. Cl.  
*H01L 21/00* (2006.01)

(52) U.S. Cl. .......................................................... 438/48
(58) Field of Classification Search .................... 438/48  
See application file for complete search history.

(56) References Cited

U.S. PATENT DOCUMENTS

| | | | |
|---|---|---|---|
| 4,956,619 A | | 9/1990 | Hornbeck |
| 5,362,681 A | | 11/1994 | Roberts, Jr. et al. |
| 5,435,876 A | | 7/1995 | Alfaro et al. |
| 5,731,229 A | * | 3/1998 | Kato et al. ..................... 438/50 |
| 5,824,177 A | | 10/1998 | Yoshihara et al. |
| 5,923,995 A | | 7/1999 | Kao et al. |
| 6,426,239 B1 | | 7/2002 | Gogoi et al. |
| 6,555,417 B2 | | 4/2003 | Spooner et al. |
| 6,759,660 B2 | * | 7/2004 | Izumi et al. ............ 250/370.01 |
| 6,833,288 B2 | | 12/2004 | Kang et al. |
| 6,844,623 B1 | * | 1/2005 | Peterson et al. ............ 257/723 |
| 6,946,326 B2 | | 9/2005 | Spooner et al. |
| 6,946,366 B2 | | 9/2005 | Spooner et al. |
| 2005/0030447 A1 | * | 2/2005 | Hsu et al. .................... 349/102 |

FOREIGN PATENT DOCUMENTS

| | | |
|---|---|---|
| EP | 0 675 536 A1 | 10/1995 |
| EP | 1 026 735 A2 | 8/2000 |

\* cited by examiner

*Primary Examiner*—Matthew Smith  
*Assistant Examiner*—Ankush Singal  
(74) *Attorney, Agent, or Firm*—Marshall, Gerstein & Borun LLP

(57) ABSTRACT

A plurality of MEMS structures is formed on a wafer. The wafer is mounted on a dicing frame assembly having a dicing frame and a dicing tape attached to the dicing frame. A protective layer is applied to cover the entire surface of the wafer or may be limited to the portion of the surface of the wafer that includes the MEMS structures by any suitable means of coating techniques to protect the MEMS structures during dicing operation. The protective layer base material to be provided on the wafer may include linear carbon chain molecules containing 12-18 carbon atoms. The dicing operation is performed to divide the wafer into individual die. The protective layer is removed by any suitable process including decomposition, vaporized, sublimation or the like. For example, the protective layer may be evaporated through the application of heat after the die attachment process is completed. The heat application may be part of the cure cycle required for die bonding or may be a separate operation. Finally, the individual die are wire bonded and sealed to complete the packaging operation.

32 Claims, 3 Drawing Sheets

US 7,297,567 B2

METHOD FOR SINGULATING A RELEASED MICROELECTROMECHANICAL SYSTEM WAFER

TECHNICAL FIELD

This patent generally relates to protection of delicate mechanical structures on a wafer during singulation from a wafer, and more particularly, to a method and manufacturing process of protecting the structures attached to a released microelectromechanical system (MEMS) wafer.

BACKGROUND

Typical MEMS devices are comprised of mechanical structures built on one or more layers separated from each other and the substrate by sacrificial material. At the end of a formation process, the sacrificial material is removed thereby releasing the structure to move as intended. By their nature, these tiny structures are quite delicate and therein lies a conflict. Typical singulation or dicing techniques use water jets for cooling the substrate and dicing blade. These water jets can destroy a released MEMS device. Dicing the wafer prior to release is possible since the sacrificial material, which is still in place, serves to stiffen the microstructure against the water jets. However the task of releasing the large number of individual die cut from a wafer is also a problem. Methods to handle individual die have been proposed but in general are unsatisfactory because of the excessive handling required. Dicing after release requires protecting the delicate structures.

Several methods are proposed in the art that provide post release dicing, and each of these methods have several things in common. Firstly, they require a film to be prepared with a pattern that matches the particular device pattern on a wafer. Secondly, this film must be precision aligned and attached to the wafer. Finally, after dicing, this film must be removed. In some cases this means by mechanically peeling it off each die individually. All of these methods require special equipment and take considerable time and are expensive to accomplish.

Accordingly, an efficient method of singulation or dicing of a wafer of released die is needed.

BRIEF DESCRIPTION OF THE DRAWINGS

For a more complete understanding of the disclosure, reference should be made to the following detailed description and accompanying drawings wherein.

DETAILED DESCRIPTION

Figure 1:
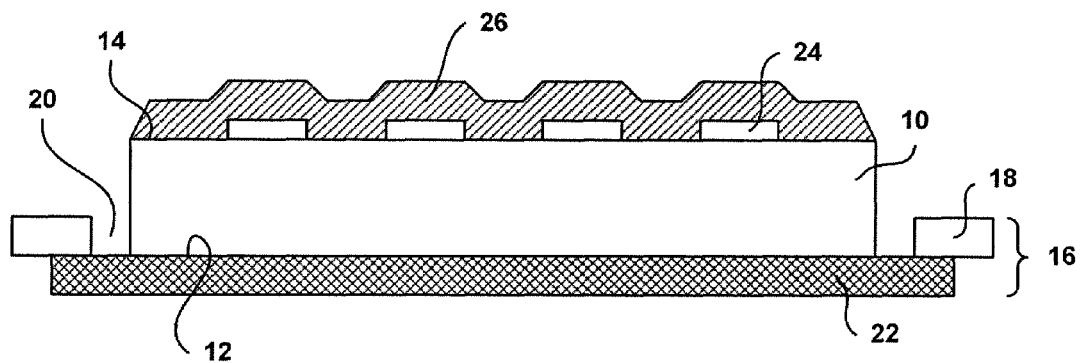
FIG. 1 is a cross-sectional view of a portion of a MEMS wafer according to a described embodiment of the invention.

While the present disclosure is susceptible to various modifications and alternative forms, certain embodiments are shown by way of example in the drawings and these embodiments will be described in detail herein. It will be understood, however, that this disclosure is not intended to limit the invention to the particular forms described, but to the contrary, the invention is intended to cover all modifications, alternatives, and equivalents falling within the spirit and scope of the invention defined by the appended claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Unless a claim element is defined by reciting the word "means" and a function without the recital of any structure, it is not intended that the scope of any claim element be interpreted based on the application of 35 U.S.C. §112, sixth paragraph.

This disclosure describes embodiments of an efficient method of dicing post release die from a wafer. The method may provide for protection of the delicate, post released, die during dicing through the application of a simple protective coating. This protective coating is both easy to apply and to remove.

Figure 2:
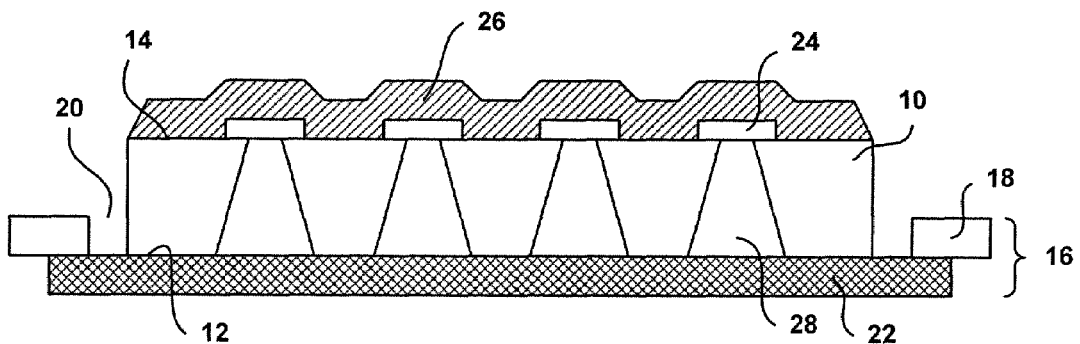
FIG. 2 is a cross-sectional view of a portion of a MEMS wafer according to a described embodiment of the invention.
Figure 3:
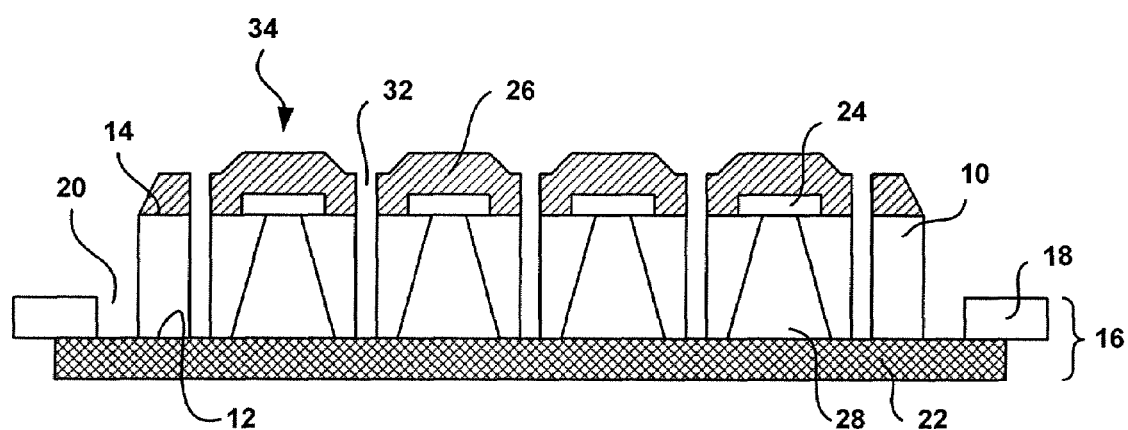
FIG. 3 is a cross-sectional view of a portion of a MEMS wafer diced into a plurality of MEMS dies according to a described embodiment of the invention.

FIGS. 1-3 illustrate cross-sectional views of separating, singulating or dicing a released microelectromechanical system (MEMS) wafer into individual MEMS die so as to obtain a MEMS device. A silicon wafer 10 in the form of a thin disk includes a blank face 12 and a circuit forming face 14. A plurality of MEMS structures 24 is formed on the circuit forming face 14 of the wafer 10. The MEMS structures 24 are integrated circuits and are arranged in rows and columns. A dicing frame assembly 16 includes a dicing frame 18 having an opening 20 and a dicing tape 22 attached to the dicing frame 18. The wafer 10 is mounted on the dicing frame assembly 16 such that the blank face 12 of the wafer 10 is fixedly attached to the dicing tape 22. A protective layer 26 is applied to cover the entire surface of the circuit forming face 14 of the wafer 10 or may be limited to the portion of the surface of the circuit forming face 14 that includes the MEMS structures 24 by any suitable means of coating techniques, including, evaporation/condensation, spin coating, spraying, brushing, flow coating, or screen printing. The protective layer 26 acts to protect the MEMS structures 24 during dicing operation. The protective layer 26 may be a water insoluble coating, although depending on the dicing method and whether it employs water jets, water soluable coatings may be used. The protective layer 26 may have any suitable thickness for protecting the die 26, and for example, as shown in FIG. 1, the protective layer 26 may completely cover the MEMS structures 24. However, the protective layer 26 need only secure the MEMS structures 24 against damaging movement during the dicing operation, and the coating need only have a thickness, whether or not completely covering the MEMS structures, to accomplish this function.

For dicing operations that employ water jet cooling, the protective layer 26 may be chosen from a set of materials with the following characteristics:

1) Insoluble in Water

To ensure the protective coating remains stable in the presence of water in conventional water cooled dicing.

2) Soft Solid Form at Room Temperature

To ensure that as the material solidifies on the wafer surface yet not damage the delicate MEMS structures.

3) High Vapor Pressure or Decomposition Temperature Near 150 C

To permit efficient removal of the protective layer post-dicing.

4) No Residue After Removal

To ensure residual material does not interfere with the MEMS device operation.

5) No Tendency to Create or Enhance Stiction

To avoid stiction, which is a common problem of MEMS devices and must be minimized.

In one embodiment the protective layer 26 may be a polynorbornene (PNB) material, commonly available under the trade designation Unity from Promerus, LLC, or of any similar materials. Generally, this material may be applied as a liquid and cured to a solid with heat. Decomposition occurs at an elevated temperature range between 200° C. and 425° C. Alternatively, the protective layer 26 material may be chosen from a set of materials that can be evaporated or sublimated off the wafer for removal. One set of materials includes linear carbon chain molecules containing 12-18 carbon atoms. For example, the protective layer 26 may be Dodecanol, Heptadecanal, Heptadecanol, or chlorinated materials such as 2,6-dichloro-2,6-dimethylheptane. In one preferred embodiment, the protective layer 26 is Cetyl alcohol $CH_3(CH_2)_{15}OH$ also known as 1-Hexadecanol with a melting point greater than 24° C. and preferably at least 50° C.; boiling point greater than 100° C. and preferably at least 150° C.

In FIG. 2, an optional through hole 28, created as a feature of certain bulk micromachined MEMS devices is covered by various thin films of MEMS structures 24. The MEMS structures 24 are shown in FIG. 2 coated with the protective layer 26 to reinforce the device during singulation.

As described, use of a protective coating in a die dicing process protects MEMS structures from shock and stress created by the dicing process. The protective coating offers additional advantages and features. In FIG. 3, the wafer 10 may be singulated by using a dicing saw, a laser, or scribing and breaking on the circuit forming face 14 of the wafer 10. All of these dicing methods generate debris that, if caused to engage during the MEMS structure during the dicing process, can negatively impact the MEMS die. The protective layer 26 keeps the debris from engaging the MEMS devices/structures.

In one embodiment, the dicing operation is performed using a diamond dicing saw (not shown). During the dicing operation, water is jet sprayed over the wafer 10 with the protective layer 26 and into the kerfs 32 to clean away the debris of the dicing and as well as to cool the wafer 10 and the saw blade (not shown). Due to the existence of the protective layer 26, damage that may be caused by the water jets on the circuit forming face 14 and MEMS structures 24 is minimized. Depending on the characteristics of the protective layer 26, following dicing, the dicing frame 16 with singulated die may be heated to remove the protective layer 26. However in one embodiment, the protective layer 26 may be advantageously left in place to aid in the vacuum pickup of the singulated die. The singulated wafer is then transferred to a pick-and-place station wherein a die bonding operation is performed. At the die bonding operation, each individual die 34 is removed from the dicing frame assembly 16 and secured to a package substrate (not shown). To complete the die attachment process, additional processing may be performed for example to cure a die bond adhesive by heating at a desired temperature for a predetermined time. The protective layer 26 is decomposed or vaporized through the application of heat. The heat application may be part of the cure cycle required for die bonding or may be separate. If the MEMS die 34 has a through hole etched in it covered by a membrane, the protective layer 26 will likely be sufficient to allow vacuum picking of the MEMS device from the dicing tape 22 depending on the exact design of the device. Finally, once the protective layer 26 is removed, the die 34 may be wire bonded and the package completed.

Figure 4:
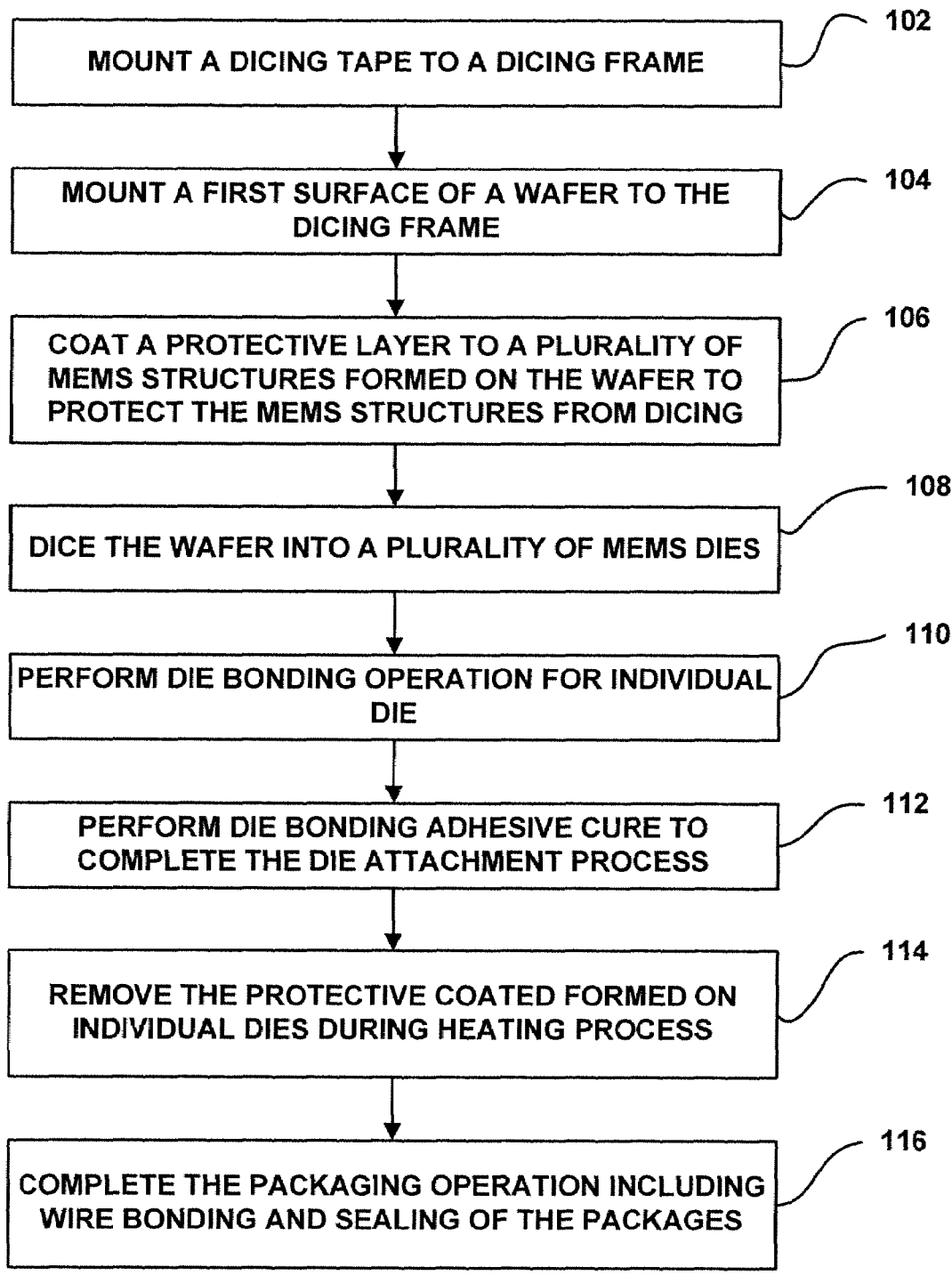
FIG. 4 is a flow chart for a method of protecting the MEMS die according to a described embodiment of the invention.

FIG. 4 is a flowchart detailing the process steps of an exemplary method for protecting a plurality of MEMS structures formed on the MEMS wafer during dicing, according to the invention. This process is suitable for a wide variety of devices including, but not limited to, pressure sensors, accelerometers, gyroscope, microphones, optical switches, tilting mirror display devices, RF switches, as well as integrated circuits with air bridge interconnects. At 102, a dicing tape is mounted to a dicing frame in a conventional manner. The MEMS wafer includes a blank face that is then fixedly attached to the dicing tape within the dicing frame in 104. A plurality of MEMS structures formed on a circuit forming face of the wafer is covered with a protective layer in 106. As described above, in one embodiment, the protective layer is a Cetyl alcohol. While it can be vapor transported to the wafer or heated and applied as a liquid, the preferred method is to dissolve the Cetyl alcohol in isopropyl alcohol and to spray the protective layer onto the wafer. The protective coating will air dry to a solid protective coating but may be reflowed at 50° C. so that the protective coating enters all of the small spaces in the MEMS device to ensure total protection of the device. At 108, the wafer is then diced into a plurality of MEMS die. The circuit forming face of the wafer is fully protected from the cooling water jets and a post dicing clean using additional water jets is allowed. The dicing operation may be performed by using a saw, using a laser, or using scribing and breaking. At 110, a conventional die bonding operation is performed by using a pick-and-place station to remove each individual die from the dicing frame and adhesively bond the die to a package substrate. However, virtually any post dicing operation may be performed on the die. For the described embodiment, to complete the die attachment process, additional processing may be performed to cure the die bond adhesive at a temperature about 150° C. for approximately 30 minutes as shown at 112. This cure cycle is generally sufficient to remove the protective coating. However additional time at elevated temperature may be employed to ensure complete remove the protective coating. For example, at 114, the protective layer is heated at a temperature about 150° C. for an additional 30 minutes to 60 minutes to effect its removal. At 116, individual die are wire bonded and the package is sealed to complete the packaging operation.

All references, including publications, patent applications, and patents, cited herein are hereby incorporated by reference to the same extend as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. A method for protecting a MEMS structure on a wafer, the method comprising:
   providing a protective layer on the plurality of MEMS structures attached to the wafer;
   dicing the wafer into a plurality of MEMS die; and
   removing the protective layer from individual MEMS die;
   wherein the protective layer is a water insoluble coating and is selected from the group of materials consisting of linear carbon chain molecules containing 12-18 carbon atoms.

2. The method of claim 1, wherein the water insoluble coating is soluble in isopropyl alcohol.

3. The method of claim 1, wherein dicing the wafer comprises sawing the wafer using a saw.

4. The method of claim 1, wherein removing the protective layer comprises heating the protective layer.

5. A method for protecting a MEMS structure on a wafer, the method comprising:
   providing a protective layer on a plurality of MEMS structures attached to the wafer;
   dicing the wafer into a plurality of MEMS die; and
   removing the protective layer from individual MEMS die;
   wherein the protective layer is a water insoluble consists at least one Dodecanol, Heptadecanal, Heptadecanol, chlorinated material, Cetyl alcohol or polynorborene (PNB) material.

6. The method of claim 5, wherein the chlorinated material is 2,6-dichloro-2,6-dimethylheptane.

7. The method of claim 5, wherein the water insoluble coating is soluble in isopropyl alcohol.

8. The method of claim 5, wherein removing the protective layer comprises heating the protective layer.

9. The method of claim 5, wherein dicing the wafer comprises sawing the wafer using a saw.

10. A method for singulating a wafer, the method comprising:
    providing a protective layer having a boiling point greater than about 100° C.;
    providing a dicing frame assembly including a dicing frame and a dicing tape attached to the dicing frame;
    mounting the wafer to the dicing frame assembly; and
    dicing the wafer;
    wherein the protective layer is water insoluble and is selected from the group of materials consisting of linear carbon chain molecules containing 12-18 carbon atoms.

11. The method of claim 10, wherein the wafer is provided with a plurality of MEMS structures, and either or both of the wafer and the MEMS structure is or arc covered by the protective layer, respectively.

12. The method of claim 11, wherein the wafer or MEMS structures are at least partially covered by the protective layer.

13. The method of claim 11, wherein the wafer or MEMS structures are completely covered by the protective layer.

14. The method of claim 10, wherein dicing the wafer comprises dicing the wafer into a plurality of MEMS die.

15. A method for singulating a wafer, the method comprising:
    providing a protective layer having a boiling point greater than about 100° C.;
    providing a dicing frame assembly including a dicing frame and a dicing tape attached to the dicing frame;
    mounting the wafer to the dicing frame assembly; and
    dicing the wafer;
    wherein the protective layer consists of at least one of Dodecanol, Heptadecanal, Heptadecanol, or chlorinated material.

16. The method of claim 15, wherein the chlorinated material is 2,6-dichloro-2,6-dimethylheptane.

17. A method for protecting a plurality of MEMS structures on a MEMS wafer during dicing, the method comprising:
    mounting a blank face of the MEMS wafer onto a dicing frame assembly including a dicing frame and a dicing tape;
    coating a circuit forming face of the MEMS wafer with a protective layer; and
    dicing the MEMS wafer with the protective layer and the plurality of MEMS structures into a plurality of MEMS die;
    wherein the protective layer comprises a material of linear carbon chain molecules containing 12 to 18 carbon atoms consisting of Dodecanol, Heptadecanal, Heptadecanol, or 2,6-dichloro-2,6-dimethylheptane.

18. The method of claim 17, wherein the protective layer is insoluble in water.

19. The method of claim 17, wherein the protective layer is a soft solid material.

20. The method of claim 17, wherein the protective layer is one of a wax or gel.

21. The method of claim 17, wherein the protective layer has a melting point of about 50° C.

22. The method of claim 17, wherein the protective layer has a boiling point of about 100° C.

23. A method for protecting a plurality of MEMS structures on a circuit forming face of a wafer from damage due to sawing the wafer, the method comprising:
    mounting a blank face of the wafer onto a dicing frame assembly;
    coating the wafer with a protective layer;
    dicing the wafer into a plurality of MEMS die; and
    removing the protective layer from individual die by heating;
    wherein the protective layer is water insoluble and is selected from the group of materials consisting of 12-18 carbon atoms.

24. The method of claim 23, wherein the dicing frame assembly comprises a dicing frame and a dicing tape attached to the dicing frame.

25. The method of claim 23, wherein the circuit forming face of the wafer is covered by the protective layer.

26. The method of claim 23, wherein the protective layer has a boiling point of about 150° C. to 350° C.

27. The method of claim 23, wherein the protective layer has a melting point of about 30° C. to 60° C.

28. The method of claim 23, wherein removing the protective layer is through evaporation, decomposition or sublimation.

29. A method for protecting a plurality of MEMS structures on a circuit forming face of a wafer from damage due to sawing the wafer, the method comprising:
- mounting a blank face of the wafer onto a dicing frame assembly;
- coating the wafer with a protective layer;
- dicing the wafer into a plurality of MEMS die; and
- removing the protective layer from individual MEMS die by heating;

wherein the protective layer consists of at least one of Dodecanol, Heptadecanal, Heptadecanol, or chlorinated material.

30. The method of claim 29, wherein the protective layer has a boiling point of about 150° C. to 350° C.

31. The method of claim 29, wherein the protective layer has a melting point of about 30° C. to 60° C.

32. The method of claim 29, wherein removing the protective layer is through evaporation, decomposition or sublimation.

* * * * *